(12) United States Patent
Hu

(10) Patent No.: US 12,408,528 B2
(45) Date of Patent: Sep. 2, 2025

(54) METHOD OF MANUFACTURING SPLICED DISPLAY SCREEN AND SPLICED DISPLAY SCREEN

(71) Applicant: SHENZHEN CHINA STAR OPTOELECTRONICS SEMICONDUCTOR DISPLAY TECHNOLOGY CO., LTD., Guangdong (CN)

(72) Inventor: Xiaobo Hu, Guangdong (CN)

(73) Assignee: SHENZHEN CHINA STAR OPTOELECTRONICS SEMICONDUCTOR DISPLAY TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 17/620,730

(22) PCT Filed: Dec. 9, 2021

(86) PCT No.: PCT/CN2021/136736
§ 371 (c)(1),
(2) Date: Dec. 19, 2021

(87) PCT Pub. No.: WO2023/097736
PCT Pub. Date: Jun. 8, 2023

(65) Prior Publication Data
US 2024/0032367 A1 Jan. 25, 2024

(30) Foreign Application Priority Data
Nov. 30, 2021 (CN) .......................... 202111445943.1

(51) Int. Cl.
*H01L 29/08* (2006.01)
*H01L 25/075* (2006.01)
(Continued)

(52) U.S. Cl.
CPC ......... *H10K 59/18* (2023.02); *H01L 25/0753* (2013.01); *H10H 20/857* (2025.01);
(Continued)

(58) Field of Classification Search
CPC ............ H10K 77/111; H10K 2102/311; H10K 59/18; H10K 71/851; H10K 71/80;
(Continued)

(56) References Cited

U.S. PATENT DOCUMENTS

| 2012/0190220 | A1 | 7/2012 | Lee | |
|---|---|---|---|---|
| 2022/0216362 | A1* | 7/2022 | Chen | ...................... H10H 20/01 |
| 2024/0015898 | A1* | 1/2024 | Jiang | ...................... H05K 5/30 |

FOREIGN PATENT DOCUMENTS

| CN | 105322104 A | 2/2016 |
|---|---|---|
| CN | 106654063 A | 5/2017 |

(Continued)

OTHER PUBLICATIONS

International Search Report in International application No. PCT/CN2021/136736, mailed on Jul. 28, 2022.
(Continued)

*Primary Examiner* — Ismail A Muse
(74) *Attorney, Agent, or Firm* — PV IP PC; Wei Te Chung

(57) ABSTRACT

The present application provides a method of manufacturing a spliced display screen and a spliced display screen. The method of manufacturing a spliced display screen includes: providing a glass substrate and a display panel, wherein the display panel includes a flexible substrate and a display unit, and the display panel includes a bonding area and a non-bonding area; attaching a first protective film to a side of the display unit away from the glass substrate; disposing a supporting glass on a side of the first protective film away from the flexible substrate; separating the glass substrate from the flexible substrate; cutting the first protective film, the display panel, and the supporting glass located in the non-bonding area to obtain a plurality of first components;
(Continued)

providing a second protective film, and splicing the plurality of first components on a surface of a side of the second protective film.

12 Claims, 4 Drawing Sheets

(51) Int. Cl.
*H10H 20/857* (2025.01)
*H10K 59/18* (2023.01)
*H10K 77/10* (2023.01)
*H10H 20/01* (2025.01)
*H10K 102/00* (2023.01)

(52) U.S. Cl.
CPC ....... *H10K 77/111* (2023.02); *H10H 20/0364* (2025.01); *H10K 2102/311* (2023.02)

(58) Field of Classification Search
CPC ..... G09G 3/32; H01L 25/0753; G06F 3/1446; H10H 29/142
See application file for complete search history.

(56) References Cited

FOREIGN PATENT DOCUMENTS

| CN | 106773207 | A | 5/2017 |
|----|-----------|---|--------|
| CN | 108181752 | A | 6/2018 |
| CN | 108777114 | A | 11/2018 |
| CN | 109192764 | A | 1/2019 |
| CN | 109860255 | A | 6/2019 |
| CN | 109950396 | A | 6/2019 |
| CN | 110164874 | A | 8/2019 |
| CN | 113629096 | A | 11/2021 |
| WO | 2018043337 | A1 | 3/2018 |

OTHER PUBLICATIONS

Written Opinion of the International Search Authority in International application No. PCT/CN2021/136736, mailed on Jul. 28, 2022.

Chinese Office Action issued in corresponding Chinese Patent Application No. 202111445943.1 dated Feb. 1, 2023, pp. 1-12.

* cited by examiner

| providing a glass substrate and a display panel, wherein the display panel comprises a flexible substrate and a display unit sequentially formed on a surface of a side of the glass substrate, and the display panel comprises a bonding area and a non-bonding area; | 101 |

⇩

| attaching a first protective film to a side of the display unit away from the glass substrate; | 102 |

⇩

| disposing a supporting glass on a side of the first protective film away from the flexible substrate; | 103 |

⇩

| separating the glass substrate from the flexible substrate; | 104 |

⇩

| cutting the first protective film, the display panel, and the supporting glass located in the non-bonding area to obtain a plurality of first components; | 105 |

⇩

| providing a second protective film, and splicing the plurality of first components on a surface of a side of the second protective film, wherein the second protective film is disposed on a side of the flexible substrate away from the first protective film. | 106 |

FIG. 1

METHOD OF MANUFACTURING SPLICED DISPLAY SCREEN AND SPLICED DISPLAY SCREEN

BACKGROUND OF INVENTION

Field of Invention

The present application relates to the field of display technology, and in particular to a method of manufacturing a spliced display screen and a display screen.

Description of Prior Art

Light-emitting diodes (LEDs) are semiconductor electronic components that can convert electrical energy into light energy. Because of their small sizes, long service life, colorful colors, and low energy consumption, the light-emitting diodes widely are used in fields of lighting, display screens, signal lights, backlight sources, toys, and so on. A mini-LED is also known as sub-millimeter light-emitting diode, usually having a size of 80 micrometers to 200 micrometers, which is a new generation of LED technology and inherits characteristics of small-pitch LEDs, such as high efficiency, high reliability, high brightness, fast response times, and lower power consumption and cost.

In recent years, flexible electronic products have attracted widespread attention around the world and have been rapidly developed. When making large-sized screens in the flexible electronic products, a plurality of flexible devices need to be spliced together. However, the existing flexible devices have a problem of great difficulty in splicing.

SUMMARY OF INVENTION

Embodiments of the present application provide a method of manufacturing a display module and a display panel, which solves the problem of splicing difficulty in existing flexible devices.

An embodiment of the present application provides a method of manufacturing a spliced display screen, and the manufacturing method includes:

providing a glass substrate and a display panel, wherein the display panel includes a flexible substrate and a display unit sequentially formed on a surface of a side of the glass substrate, and the display panel includes a bonding area and a non-bonding area;

attaching a first protective film to a side of the display unit away from the glass substrate;

disposing a supporting glass on a side of the first protective film away from the flexible substrate;

separating the glass substrate from the flexible substrate;

cutting the first protective film, the display panel, and the supporting glass located in the non-bonding area to obtain a plurality of first components;

providing a second protective film, and splicing the plurality of first components on a surface of a side of the second protective film, wherein the second protective film is disposed on a side of the flexible substrate away from the first protective film.

Optionally, the step of splicing the plurality of first components on the surface of the side of the second protective film includes:

disposing an end of one of the first components away from the bonding area adjacent to an end of another one of the first components away from the bonding area.

Optionally, after the step of splicing the plurality of first components on the surface of the side of the second protective film, the manufacturing method further includes:

separating the supporting glass from the first protective film.

Optionally, the manufacturing method further includes:

electrically connecting a chip-on-film to one end of each of the flexible substrate located in the bonding area; and electrically connecting a printed circuit board to an end of each of the chip-on-film away from the flexible substrate.

Another embodiment of the present application also provides a spliced display screen, wherein the spliced display screen includes:

a second protective film;

a plurality of first components arranged adjacently, wherein the plurality of first components are arranged on a same side of the second protective film to form a plurality of second components, each of the first components includes a display panel and a first protective film that are stacked, the display panel is disposed between the first protective film and the second protective film, wherein the display panel includes a flexible substrate and a display unit that are stacked, and the display panel includes a bonding area and a non-bonding area.

Optionally, an end of the first protective film away from the bonding area is flush with an end of the flexible substrate away from the bonding area.

Optionally, a number of rows of the plurality of second components spliced on the second protective film is n; a number of columns of the plurality of second components spliced on the second protective film is 1; and the n≥1.

Optionally, the first protective film and the second protective film are both polyethylene terephthalate (PET) films.

Optionally, the display unit includes one of LED, mini-LED, micro-LED, or OLED.

Optionally, a chip-on-film is disposed at one end of each of the flexible substrate away from the non-bonding area; and a printed circuit board is disposed at one end of each of the chip-on-film away from the flexible substrate.

Beneficial effects of the present application are: in the method of manufacturing the spliced display screen provided in the embodiments of the present application, the first protective film is attached to the side of the display panel away from the glass substrate; the supporting glass is disposed on the side of the first protective film away from the flexible substrate; then the glass substrate is separated from the flexible substrate; the first protective film and the display panel located in the non-bonding area are cut, and the cut first protective film and the flexible substrate are defined as the first component; the plurality of first components are spliced on the second protective film to realize the splicing of the flexible device, thereby solving the problem of splicing difficulty in existing flexible devices.

BRIEF DESCRIPTION OF DRAWINGS

In order to more clearly illustrate the technical solutions of the embodiments of the application, the drawings illustrating the embodiments will be briefly described below. Obviously, the drawings in the following description merely illustrate some embodiments of the present invention. Other drawings may also be obtained by those skilled in the art according to these figures without paying creative work.

In order to have a more complete understanding of the present application and its beneficial effects, the description will be given below in conjunction with the accompanying drawings. The same reference numerals in the following description indicate the same elements.

FIG. 1 is a schematic flowchart of a method of manufacturing a spliced display screen provided by an embodiment of the present application.

DETAILED DESCRIPTION OF PREFERRED EMBODIMENTS

Figure 2:
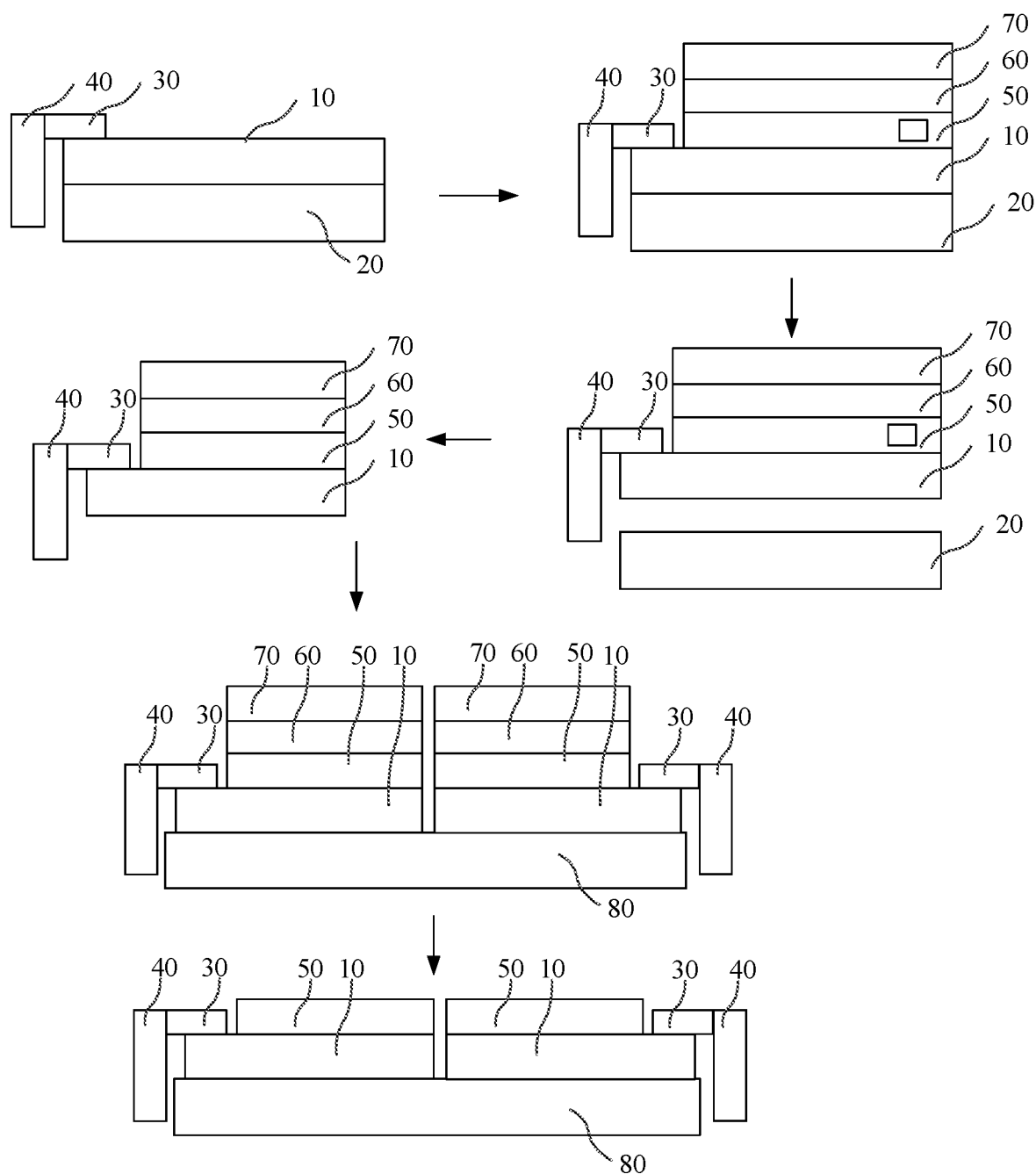
FIG. 2 is a schematic structural diagram corresponding to the manufacturing method shown in FIG. 1.

The technical solutions in the embodiments of the present application will be clearly and completely described in the following with reference to the accompanying drawings in the embodiments. It is apparent that the described embodiments are only a part of the embodiments of the present application, and not all of them. All other embodiments obtained by a person skilled in the art based on the embodiments of the present application without creative efforts are within the scope of the present application.

In the description of this application, it should be understood that the terms "center", "longitudinal", "transverse", "length", "width", "thickness", "upper", "lower", "front", "Rear", "left", "right", "vertical", "horizontal", "top", "bottom", "inside", "outside", "clockwise", "counterclockwise", and the like are based on the orientation or positional relationship shown in the drawings, and is merely for the convenience of describing the present invention and simplifying the description, rather than indicating or implying that the device or element referred to must have a specific orientation, structure and operation in a specific orientation, which should not be construed as limitations on the present invention. In addition, the terms "first" and "second" are used for descriptive purposes only, and cannot be understood as indicating or implying relative importance or implicitly indicating the number of technical features indicated. Therefore, the features defined as "first" and "second" may explicitly or implicitly include one or more of the features. In the description of the present application, the meaning of "a plurality" is two or more, unless specifically defined otherwise.

In manufacturing processes of at least part of flexible devices in flexible electronic products, a flexible substrate is often formed on a rigid glass substrate first, then related electronic devices are fabricated on the flexible substrate, and the glass substrate is separated from the flexible substrate after the fabrication of the related electronic devices is completed, thereby forming a flexible device with the flexible substrate as a base. To make a large-sized screen, a plurality of flexible devices need to be spliced together; however, it is difficult to splice flexible devices because their edges are prone to curling, and it is difficult to control splicing seams. In another approach, a flexible substrate is first formed on a rigidglass substrate, then related electronic devices are fabricated on the flexible substrate, then a display panels are formed after the fabrication of the related electronic devices is completed, and the plurality of display panels are spliced together followed by removing the glass substrate. However, there are technical problems in separating the glass substrate from the flexible substrate using laser lift-off technology after splicing.

Therefore, in order to solve the above-mentioned problems, the present application proposes a method of manufacturing a spliced display screen and a display screen. The present application will be further described below in conjunction with the drawings and implementations.

Referring to FIG. 1 and FIG. 2. FIG. 1 is a schematic flow diagram of a method of manufacturing a spliced display screen provided by an embodiment of the present application, and FIG. 2 is a schematic structural diagram corresponding to the method shown in FIG. 1. The embodiment of the present application provides a method of manufacturing a spliced display screen, and the specific process of the method of manufacturing a display module is as follows:

101. providing a glass substrate and a display panel, wherein the display panel includes a flexible substrate and a display unit sequentially formed on a surface of a side of the glass substrate, and the display panel includes a bonding area and a non-bonding area.

A glass substrate 20 is provided, and a display panel is prepared on the glass substrate 20. The display panel includes a flexible substrate 10 and a display unit which are sequentially prepared on a surface of a side of the glass substrate 20.

In this embodiment, a material of the flexible substrate 10 is preferably a high-temperature resistant polyimide (PI) material. In other embodiments, the flexible substrate 10 may also be made of a material including silicon dioxide, polyester resin, polyethylene, polypropylene, polystyrene, polylactic acid, polyethylene terephthalate, or polyurethane.

In this embodiment, the display unit is a mini-LED. In other embodiments, the display unit may further include: one of a light-emitting diode (LED), a micro-LED, or an organic light-emitting diode (OLED).

The manufacturing of the display panel also includes: electrically connecting a chip-on-film (COF) 30 to one end of each of the flexible substrate 10; and electrically connecting a printed circuit board (PCB) to an end of each of the chip-on-film away from the flexible substrate 40.

102. attaching a first protective film to a side of the display unit away from the glass substrate.

A first protective film 50 is attached to the side of the display unit away from the glass substrate 20, wherein a material of the first protective film 50 includes PET. By utilizing PET's good mechanical properties, oil resistance, fat resistance, dilute acid resistance, dilute alkali resistance, and resistance to most solvent, it can better protect the display panel underneath. In addition, by utilizing PET's high transparency, it can prevent impact on the light transmission performance of the display panel.

A cutting mark is disposed on the first protective film 50, and it is appreciated that the cutting mark is provided in a non-bonding area.

103. disposing a supporting glass on a side of the first protective film away from the flexible substrate.

The supporting glass 70 is connected to the first protective film 50 by a low-viscosity glue 60 at the side of the first protective film 50 away from the flexible substrate 10. The supporting glass 70 is mainly configured to support the flexible substrate 10 and the display unit after the glass substrate 20 is separated from the flexible substrate 10, so as to prevent a phenomenon of warping of the flexible substrate 10.

104. separating the glass substrate from the flexible substrate.

The glass substrate 20 is separated from the flexible substrate 10 by means of laser peeling. Exemplarily, a laser beam is adopted to irradiate the display screen to be peeled off, and the laser beam moves relative to the display screen to be peeled off, thereby separating the glass substrate 20 from the flexible substrate 10 on the display screen to be peeled off.

105. cutting the first protective film, the display panel, and the supporting glass located in the non-bonding area to obtain a plurality of first components.

Figure 3:
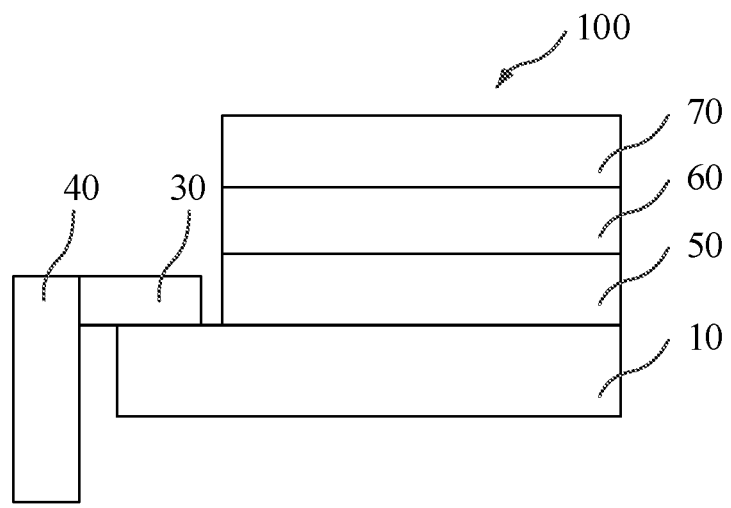
FIG. 3 is a schematic structural diagram of a first component of the spliced display screen provided by an embodiment of the present application.

Using laser cutting, the first protective film 50, the display panel, and the supporting glass 70 located in the non-bonding area are cut according to the cutting mark reserved on the first protective film 50; and the first protective film 50, the display panel, and the supporting glass 70 that have been cut are defined as the first component 100. A specific structure of the first component 100 can be referred to FIG. 3, which is a schematic diagram of a first component 100 of the spliced display screen provided by an embodiment of the present application.

The end of the cut first protective film 50 away from the bonding area, the end of the flexible substrate 10 away from the bonding area, and the end of the supporting glass 70 away from the bonding area are flush with each other.

106. providing a second protective film, and splicing the plurality of first components 100 on a surface of a side of the second protective film, wherein the second protective film is disposed on a side of the flexible substrate away from the first protective film.

The second protective film is provided, wherein a material of the second protective film includes PET. By utilizing PET's good mechanical properties, oil resistance, fat resistance, dilute acid resistance, dilute alkali resistance, and resistance to most solvent, it can better protect the display panel underneath. In addition, by utilizing PET's high transparency, it can prevent impact on the light transmission performance of the display panel.

A plurality of first components 100 are spliced on the surface of one side of the second protective film 80. Exemplarily, an end of one of the first components 100 away from the bonding area is arranged adjacent to an end of another one of the first components 100 away from the bonding area. It should be noted that there are splicing seams between adjacent first components 100, but since sizes of the splicing seams and distances between the pixels are not much different, visually seamless splicing can be achieved, thereby improving the quality of flexible splicing products.

It is appreciated that in order to realize that there is no chip-on-films 30 and printed circuit boards 40 at the splicing seams, the chip-on-films 30 of the display panels of two of the first components 100 in each row are all located at one end of the display units electrically connected to the chip-on-films 30 away from the splicing seams.

In some embodiments, after the plurality of first components 100 are spliced on the surface of one side of the second protective film 80, the supporting glass 70 is separated from the first protective film 50 to obtain a spliced flexible mini-LED screen, which can be visually seamless.

In the method of manufacturing the spliced display screen provided by the embodiment of the present application, the supporting glass 70 is disposed on the first protective film 50, so that the flexible substrate 10 can be separated from the glass substrate 20 before the plurality of flexible substrates 10 are spliced on the second protective film 80, and the supporting glass 70 is configured to support the flexible substrate 10 and the display unit, thereby preventing a phenomenon of warping after the flexible substrate 10 is separated from the glass substrate 20. After the plurality of flexible substrates 10 are spliced on the second protective film 80, the flexible substrate can be separated from the glass substrate 20, thereby realizing seamless splicing of the plurality of flexible substrates 10, which solves the problem of splicing difficulty in existing flexible devices.

Figure 4:
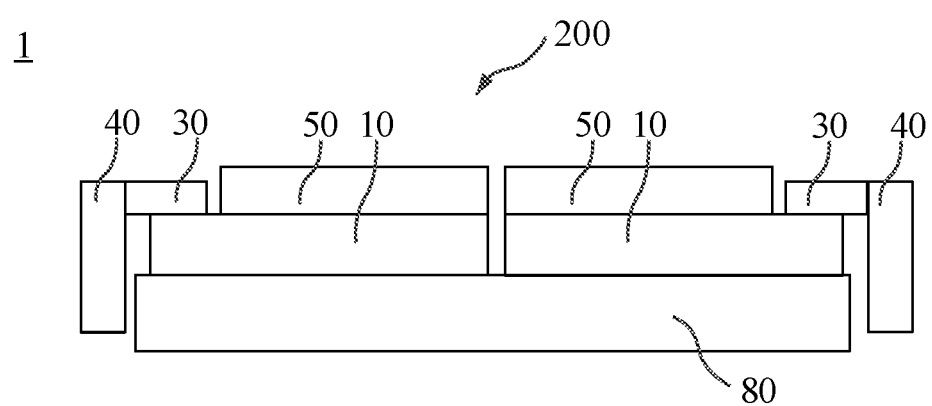
FIG. 4 is a schematic structural diagram of the spliced display screen provided by an embodiment of the present application.

Still referring to FIG. 4, FIG. 4 is a schematic structural diagram of a spliced display screen provided by an embodiment of the present application. Still another embodiment of the present application also provides a spliced display screen 1. The spliced display screen 1 includes a second protective film 80 and a plurality of first components 100 arranged adjacently on the second protective film 80, wherein the plurality of first components 100 are arranged on a same side of the second protective film 80 to form a plurality of second components 200, each of the first components 100 includes a display panel and a first protective film 5 that are stacked, the display panel is disposed between the first protective film 50 and the second protective film 80, wherein the display panel includes a flexible substrate 10 and a display unit that are stacked.

An end of the first protective film 50 away from a bonding area is flush with an end of the flexible substrate 10 away from the bonding area. By arranging an edge of the first protective film 50 to be flush with an edge of the flexible substrate 10, the splicing seams between adjacent ones of the first components 100 can be made smaller, thereby making it possible to achieve visually seamless.

The first protective film 50 and the second protective film 80 are both PET films, which can better protect the display panel underneath.

A chip-on-film 30 is disposed at one end of each of the flexible substrate 10 away from the non-bonding area; and a printed circuit board 40 is disposed at one end of each of the chip-on-film 30 away from the flexible substrate 10. In order to realize that there is no chip-on-films 30 and printed circuit boards 40 at the splicing seams, the chip-on-films 30 of the display panels of two of the first components 100 in each row are all located at one end of the display units electrically connected to the chip-on-films away from the splicing seams. For example, in this embodiment, the chip-on-film of the first component 100 on the left is located at a left end of the display unit electrically connected to the chip-on-film 30, and the chip-on-film 30 of the first component 100 on the right is located at a right end of the display unit electrically connected to the chip-on-film 30, thereby ensuring that there is no chip-on-film 30 at a splicing seam. The printed circuit board 40 of the first component 100 on the left is located at the left end of the display unit electrically connected to the printed circuit board 40, and the printed circuit board 40 of the first component 100 on the right is located at the right end of the display unit electrically connected to the printed circuit board 40, thereby ensuring that there is no printed circuit board 40 at the splicing seam.

The display unit is a mini-LED. In other embodiments, the display unit may further include: one of a light-emitting diode (LED), a micro-LED, or an organic light-emitting diode (OLED).

Figure 5:
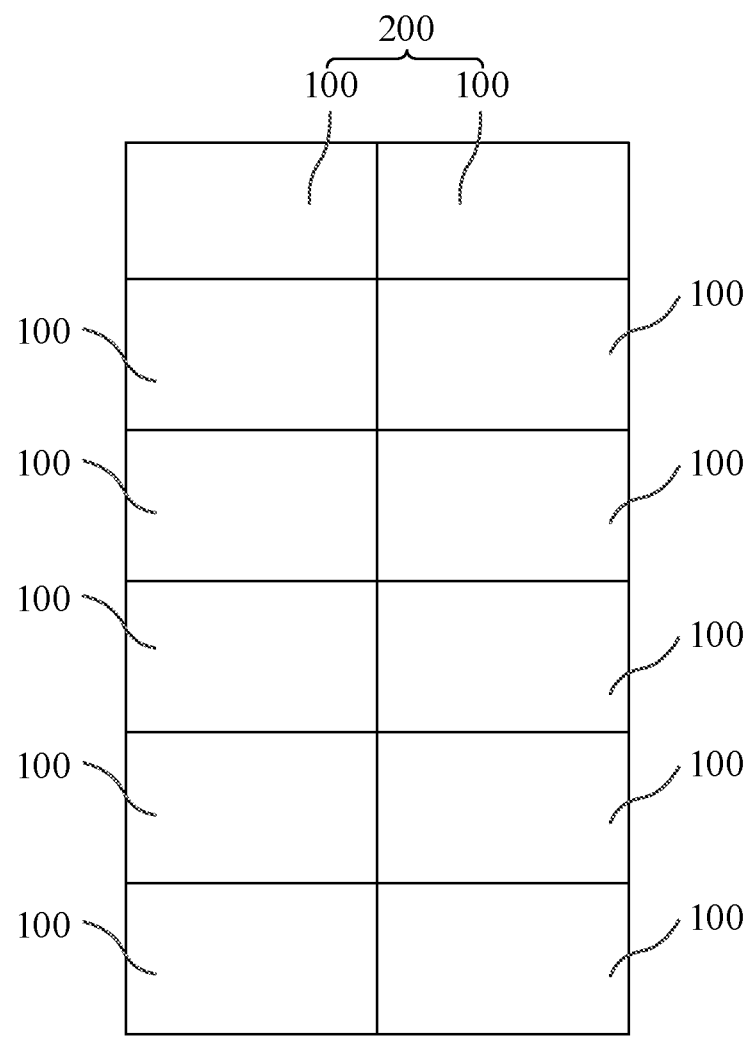
FIG. 5 is a schematic diagram of arrangement of a plurality of second components on a second protective film.

Still referring to FIG. 5, FIG. 5 is a schematic diagram of arrangement of a plurality of second components on a second protective film. A number of rows of the plurality of second components 200 spliced on the second protective film 80 is n, a number of columns of the plurality of second components 200 spliced on the second protective film 80 is 2, and n≥1. In this embodiment, n=6. In other embodiments, the number of rows of the plurality of second components 200 spliced on the second protective film 80 may be 2, the number of columns of the plurality of second components 200 spliced on the second protective film 80 may ben, and n≥1. By splicing the plurality of second components on the second protective film, flexible electronic products with large-sized screens can be realized by splicing the plurality of small flexible display panels, which can not only retain advantages of flexible display screens, but also realize large-sized screens. In addition, in the embodiment of the present application, the plurality of second components are seamlessly spliced on the second protective film, which can improve the display quality and bring a better experience to customers.

The method of manufacturing the spliced display screen and the display screen provided by the embodiments of the present application are described in detail above. Specific examples are used to explain the principle and implementation of the present application. The descriptions of the above embodiments are only used to help understand the present application. Also, for those skilled in the art, according to the ideas of the present application, there will be changes in the specific implementation and application scope. In summary, the content of this specification should not be construed as limiting the present application.

What is claimed is:

1. A method of manufacturing a spliced display screen, wherein the manufacturing method comprises:
   providing a glass substrate and a display panel, wherein the display panel comprises a flexible substrate and a display unit sequentially formed on a surface of a side of the glass substrate, and the display panel comprises a bonding area and a non-bonding area;
   attaching a first protective film to a side of the display unit away from the glass substrate;
   disposing a supporting glass on a side of the first protective film away from the flexible substrate;
   separating the glass substrate from the flexible substrate;
   cutting the first protective film, the display panel, and the supporting glass located in the non-bonding area to obtain a plurality of first components;
   providing a second protective film, and splicing the plurality of first components on a surface of a side of the second protective film, wherein the second protective film is disposed on a side of the flexible substrate away from the first protective film.

2. The manufacturing method according to claim 1, wherein the step of splicing the plurality of first components on the surface of the side of the second protective film comprises:
   disposing an end of one of the first components away from the bonding area adjacent to an end of another one of the first components away from the bonding area.

3. The manufacturing method according to claim 1, wherein after the step of splicing the plurality of first components on the surface of the side of the second protective film, the manufacturing method further comprises:
   separating the supporting glass from the first protective film.

4. The manufacturing method according to claim 1, wherein the manufacturing method further comprises:
   electrically connecting a chip-on-film to one end of each of the flexible substrate located in the bonding area; and
   electrically connecting a printed circuit board to an end of each of the chip-on-film away from the flexible substrate.

5. The manufacturing method according to claim 4, wherein splicing seams are defined between adjacent ones of the first components.

6. The manufacturing method according to claim 5, wherein each of chip-on-films of display panels of two of the first components in each row is all disposed at one end of the display unit electrically connected to the chip-on-films away from the splicing seams.

7. The manufacturing method according to claim 1, wherein an end of the first protective film away from the bonding area is flush with an end of the flexible substrate away from the bonding area.

8. The manufacturing method according to claim 1, wherein a number of rows of the plurality of second components spliced on the second protective film is n; a number of columns of the plurality of second components spliced on the second protective film is 1; and the n>1.

9. The manufacturing method according to claim 1, wherein a number of rows of the plurality of second components spliced on the second protective film is 2; a number of columns of the plurality of second components spliced on the second protective film is n; and the n>1.

10. The manufacturing method according to claim 1, wherein the first protective film and the second protective film are both polyethylene terephthalate (PET) films.

11. The manufacturing method according to claim 1, wherein the display unit comprises one of LED, mini-LED, micro-LED, or OLED.

12. The manufacturing method according to claim 1, wherein the supporting glass is connected to the first protective film by a low-viscosity glue at the side of the first protective film away from the flexible substrate.

* * * * *